(12) United States Patent
Nikitin (10) Patent No.: US 7,754,533 B2
(45) Date of Patent: Jul. 13, 2010

(54) METHOD OF MANUFACTURING A SEMICONDUCTOR DEVICE

(75) Inventor: Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/200,183

(22) Filed: Aug. 28, 2008

(65) Prior Publication Data

US 2010/0055839 A1    Mar. 4, 2010

(51) Int. Cl.
    *H01L 21/00* (2006.01)
(52) U.S. Cl. ............................. 438/113; 257/E21.602
(58) Field of Classification Search ................ 438/119, 438/26, 51, 55, 64, 106, 113; 257/E21.602
    See application file for complete search history.

(56) References Cited

U.S. PATENT DOCUMENTS

| 5,786,633 | A | | 7/1998 | Wolfgang et al. | |
|---|---|---|---|---|---|
| 6,069,024 | A | * | 5/2000 | Murakami | 438/108 |
| 6,143,116 | A | * | 11/2000 | Hayashi et al. | 156/233 |
| 6,323,458 | B1 | * | 11/2001 | Nomura et al. | 219/148 |
| 6,507,105 | B1 | | 1/2003 | Yamagata et al. | |
| 6,727,117 | B1 | | 4/2004 | McCoy | |
| 6,863,209 | B2 | * | 3/2005 | Rinne et al. | 228/194 |
| 7,083,850 | B2 | | 8/2006 | Rasiah | |
| 2002/0053735 | A1 | * | 5/2002 | Neuhaus et al. | 257/728 |
| 2003/0146497 | A1 | | 8/2003 | Abbott et al. | |
| 2005/0110161 | A1 | * | 5/2005 | Naito et al. | 257/778 |
| 2007/0025684 | A1 | | 2/2007 | Otremba | |
| 2007/0181987 | A1 | | 8/2007 | Hong et al. | |
| 2008/0073776 | A1 | * | 3/2008 | Suh et al. | 257/706 |

FOREIGN PATENT DOCUMENTS

| DE | 10 2006 037 198 A1 | 2/2008 |
|---|---|---|
| WO | 00/13823 A1 | 3/2000 |
| WO | 2004/044950 A2 | 5/2004 |
| WO | 2005/079353 A3 | 9/2005 |

OTHER PUBLICATIONS

Abstract of JP2002363614 retrieved Nov. 19, 2009 from esp@cenet database, JP2002363614 published Dec. 18, 2002.*

* cited by examiner

*Primary Examiner*—W. David Coleman
*Assistant Examiner*—Daniel Shook
(74) *Attorney, Agent, or Firm*—Dicke, Billig & Czaja, PLLC (57) ABSTRACT

A method of manufacturing a semiconductor device. One embodiment provides a carrier. A semiconductor chip is provided with a first face and a second face opposite to the first face. The semiconductor chip is placed over the carrier with the first face facing the carrier. A voltage is applied between the second face of the semiconductor chip and the carrier for attaching the semiconductor chip to the carrier.

27 Claims, 9 Drawing Sheets

METHOD OF MANUFACTURING A SEMICONDUCTOR DEVICE

BACKGROUND

This invention relates to a method of manufacturing a semiconductor device.

Semiconductor devices may include carriers on which semiconductor chips may be mounted. Furthermore, semiconductor devices may include electrically conductive means so as to provide the coupling between the components of the devices, such as the semiconductor chips and the carriers.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

Devices with semiconductor chips are described below. The semiconductor chips may be of different types and may include, for example, integrated electrical, electro-optical or electromechanical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. Semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements on its two main surfaces, that is to say on its top side and bottom side. Semiconductor chips with a vertical structure may allow a current to flow from one main surface of the semiconductor chip to another main surface of the semiconductor chip, from top to bottom or vice versa. Power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

The semiconductor chips may be fabricated on a wafer made of semiconductor material. The surface area of a semiconductor wafer may be standardized according to predetermined wafer diameters, e.g., 4 inches, 8 inches, 10 inches or 12 inches. The thickness of the semiconductor wafers may vary within ranges of typically 100 to 1000 µm, where these values may also be smaller or larger in specific applications. The semiconductor wafers may be thinned, for example, by grinding their backsides, down to a thickness in the range from 30 to 200 µm. The semiconductor wafers may be diced thereby separating the individual semiconductor chips.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers. The carriers may be of any shape, size or material. During the fabrication of the devices the carriers may be connected to each other. The carriers may also be made from one piece. The carriers may be connected among each other by connection means with the purpose of separating the carriers in the course of the fabrication. Separation of the carriers may be carried out by mechanical sawing, a laser beam, cutting, stamping, milling, etching or any other appropriate method. The carriers or parts of the carriers may be electrically conductive. They may be fabricated from metals or metal alloys, for example, copper, copper alloys, iron nickel, aluminum, aluminum alloys, or other appropriate materials. The carriers may be, for example, a leadframe or a part of a leadframe. Furthermore, the carriers may be plated with an electrically conductive material, for example, copper, silver, iron nickel or nickel phosphorus. The carriers may also be fabricated from polymers or paper and at least one surface of these carriers may be coated with an electrically conductive layer. The electrically conductive layer may be produced by metal plating or depositing metal particles or any other appropriate method.

Metal particles may be applied to the semiconductor chips and/or the carriers. The metal particles may, for example, be made of silver, gold, copper, tin or nickel. The extensions (average diameter) of the metal particles may be smaller than 100 nm and, in one embodiment, smaller than 50 nm or 10 nm or 5 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm or 5 nm. The other metal particles may have larger dimensions. The metal particles may be coated with a layer of an organic material or a flux material, for example, colophony. Furthermore, the metal particles may be dispersed in a suitable liquid or solvent. After their application, the metal particles may be heated and thereby sintered. Heating of the metal particles may be carried out by conducting a current through at least one of the semiconductor chip, the carrier and the metal particles.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conductive organic material. The external contact elements may be leads of a leadframe.

The devices may include a mold material covering at least parts of the components of the devices. The mold material may be any appropriate thermoplastic or thermosetting material. Various techniques may be employed to cover the components with the mold material, for example, compression molding, injection molding, powder molding or liquid molding.

Figure 1A:
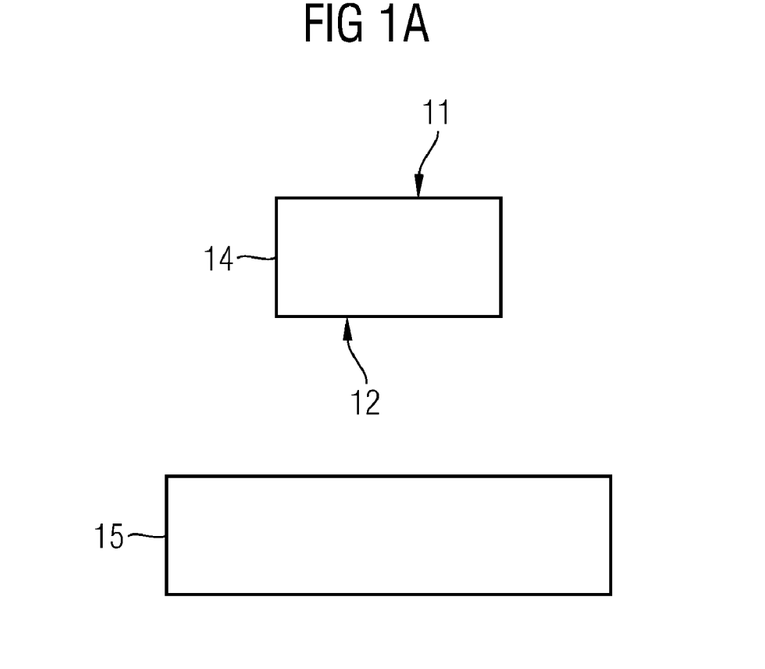
FIGS. 1A to 1C schematically illustrate one embodiment of a method to fabricate a device.
Figure 1B:
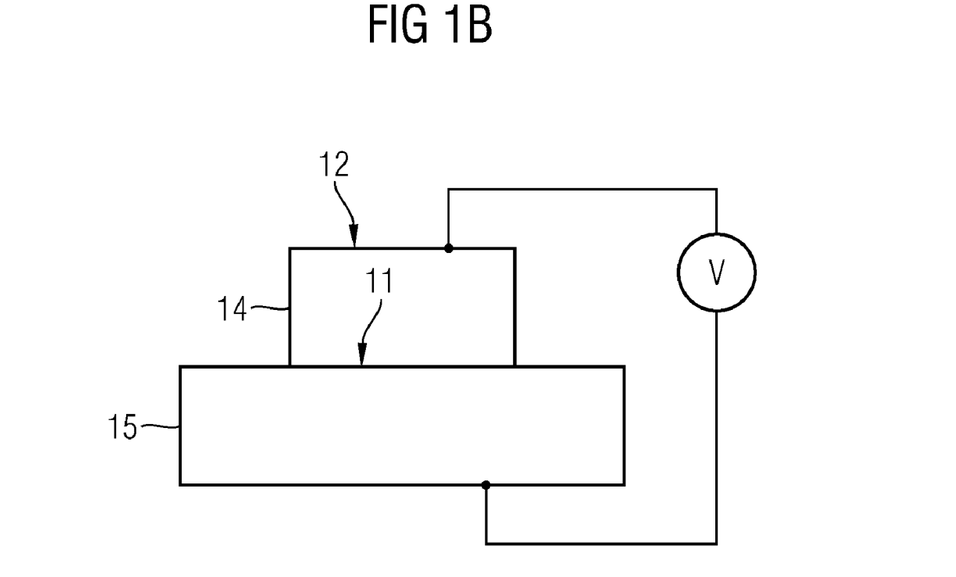
Figure 1C:
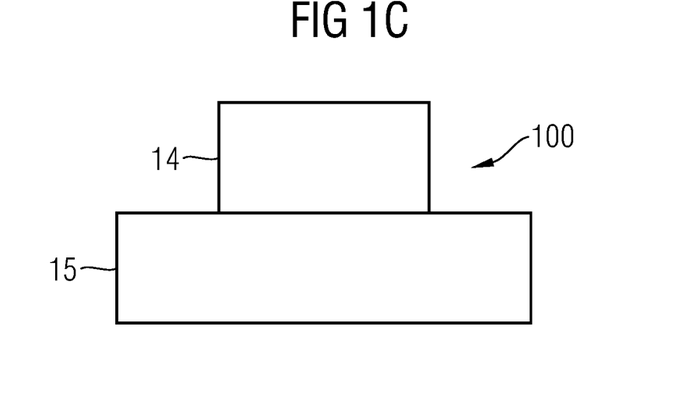

FIGS. 1A to 1C schematically illustrate a method for manufacturing a semiconductor device 100. A cross-section of the device 100 is illustrated in FIG. 1C. A semiconductor chip 14 and a carrier 15 are provided (see FIG. 1A). The semiconductor chip 14 has a first face 11 and a second face 12 opposite to the first face 11. The semiconductor chip 14 is placed over the carrier 15 with the first face 11 of the semiconductor chip 14 facing the carrier 15 (see FIG. 1B). A voltage V is applied between the second face 12 of the semiconductor chip 14 and the carrier 15 for attaching the semiconductor chip 14 to the carrier 15. The device 100 is obtained with the semiconductor chip 14 and the carrier 15 being firmly attached to each other.

In one embodiment, the semiconductor chip 14 and the carrier 15 may be attached to each other by using a material which is located at least partially between the semiconductor chip 14 and the carrier 15. FIGS. 2A to 2E schematically illustrate a method for production of such a device 200, a cross-section of which is illustrated in FIG. 2E. The method illustrated in FIGS. 2A to 2E is a development of the method illustrated in FIGS. 1A to 1C. The details of the manufacturing method that are described below can therefore be likewise applied to the method of FIGS. 1A to 1C.

Figure 2A:
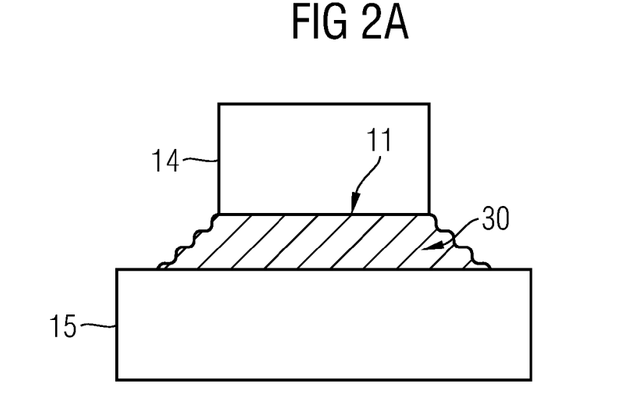
FIGS. 2A to 2E schematically illustrate one embodiment of a method to fabricate a device.

FIG. 2A illustrates a semiconductor chip 14, a carrier 15 and a material 30 arranged between the semiconductor chip 14 and the carrier 15. The carrier 15 or at least one or more surfaces of the carrier 15 may be electrically conductive. In one embodiment, the material 30 may be positioned at least partially between the semiconductor chip 14 and the carrier 15. The material 30 may be distributed in a homogeneous way between the semiconductor chip 14 and the carrier 15. In other embodiments, the material 30 may also be structured or arranged inhomogeneously so that it does not fill all the space between the semiconductor chip 14 and the carrier 15.

The material 30 may be suitable to adhere the semiconductor chip 14 to the carrier 15 when or after a voltage V has been applied.

The voltage V may cause a current to flow between the second face 12 of the semiconductor chip 14 and the carrier 15. In one embodiment, the current may flow through the material 30 and may lead to a rise in temperature of at least one of the semiconductor chip 14, the carrier 15 and the material 30.

The material 30 may, for example, be a glue (i.e., adhesive) that can be cured by applying heat to the glue. In this case, the device 200 as illustrated in FIG. 2E includes the carrier 15, the semiconductor chip 14 and a layer of cured glue 22. The voltage V applied between the semiconductor chip 14 and the carrier 15 may be used to inject a current into the glue 30 and may cause a current through the semiconductor chip 14, the glue 30 and the carrier 15. At least one of the components of the glue 30 may be electrically conductive in order to conduct the current through the glue 30. For example, the glue 30 may contain metal particles or an electrically conductive polymer. The current through the semiconductor chip 14 may lead to a rise in temperature of the semiconductor chip 14. The current through the carrier 15 may lead to a rise in temperature of the carrier 15. The current through the glue 30 may lead to a rise in temperature of the glue 30. The temperature rise or heating of one or several of the semiconductor chip 14, the glue 30 and the carrier 15 may be sufficient to cure the glue 30. For example, the semiconductor chip 14 may be heated by the current and may cause curing of the glue 30. In one example, the current may heat the glue 30 and may cause curing of the glue 30.

As an alternative to the glue, the material 30 may contain metal particles which may be sintered after the semiconductor chip 14 is placed over the carrier 15. In this case, the device 200 as illustrated in FIG. 2E includes the carrier 15, the semiconductor chip 14 and a sintered layer 22 of metal particles. The voltage V applied between the semiconductor chip 14 and the carrier 15 may lead to a current through the metal particles. The metal particles may be heated by that current and/or may be heated by a temperature rise in at least one of semiconductor chip 14 and carrier 15.

The heating of the metal particles may cause a sintering process of the metal particles leading to the formation of a solid layer 22. The solid layer 22 may be porous or homogeneous. During the sintering process the metal particles may be heated to a temperature lower than the temperature necessary to melt the material of the particles when provided in macroscopic (bulk) dimensions. The applied voltage or current may, for example, cause incipient melting of the particles. The applied current or voltage may, for example, be sufficient to melt at least the surfaces of the particles on a nm scale.

Figure 2B:
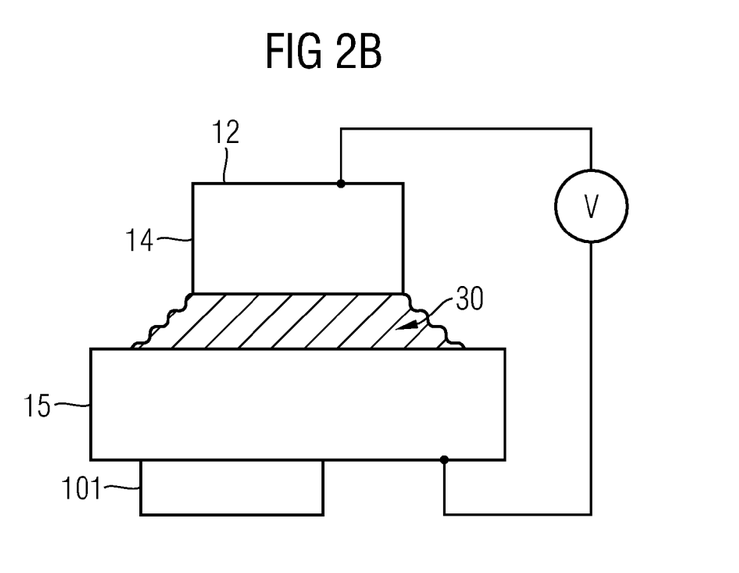
Figure 2C:
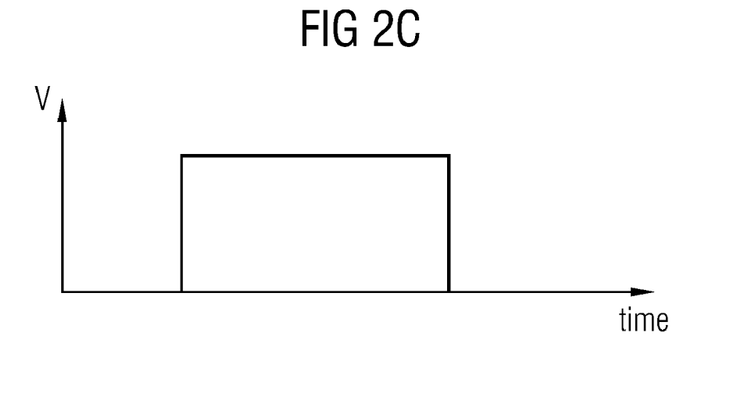
Figure 2D:
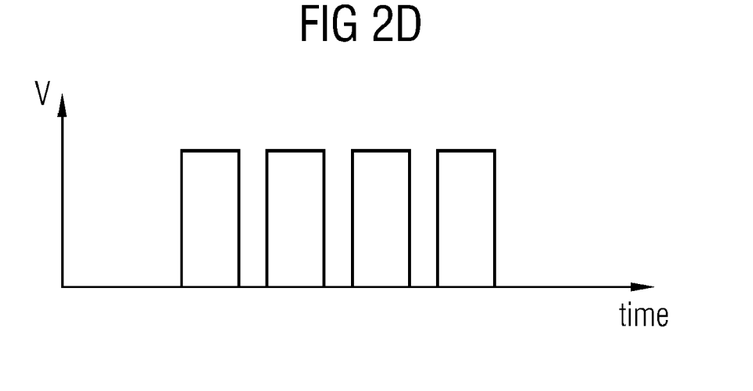
Figure 2E:
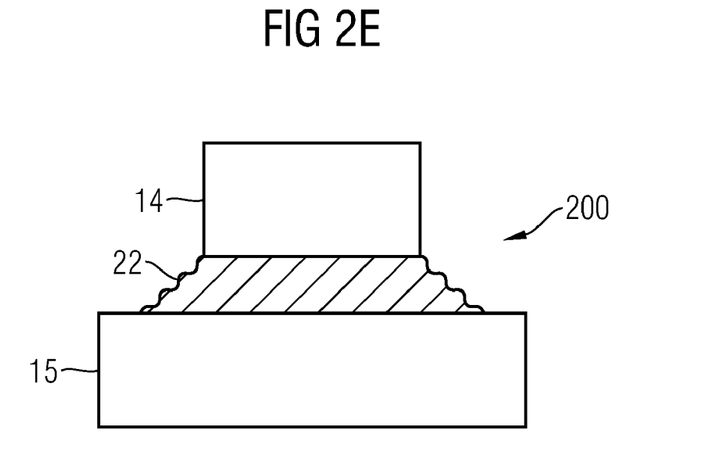

The voltage V may be applied between the semiconductor chip 14 and the carrier 15, in one embodiment between the second face 12 of the semiconductor chip 14 and the carrier 15 (see FIG. 2B). The voltage V may also be applied to the material 30. The voltage V may have a constant value or may vary in time. The voltage V may, for example, be applied during a time duration of less than 10 seconds, but may also be applied during a time duration of less than 5 seconds or less than 1 second. The voltage V may be applied in pulses with constant or with varying amplitudes. The pulses may have constant pulse widths or may have varying pulse widths. Pause intervals may separate successive pulses and the time duration of one of the pause intervals may be shorter than a time duration of one of the pulses. Pulse widths may, for example, be smaller than 0.1 µs, 1 µs, 10 µs, 100 µs, 200 µs or 300 µs or may reach up to milliseconds or several seconds. The voltage V may vary smoothly or undergo abrupt changes. FIG. 2C illustrates an example where a constant voltage V is applied during one time duration, which may be in the range from 0.1 to 10 seconds. FIG. 2D illustrates an example where the voltage V is applied in rectangular pulses, with the time duration of the pauses between the pulses being shorter than the time duration of the pulses. The voltage may also be varied arbitrarily. The sign of the voltage V may change, e.g., the voltage may be applied in reverse direction or in conduction direction of the semiconductor chip 14. The voltage V may, for example, range from 1 mV up to 10 V, 100 V, 300 V, 500 V or 1000 V or may be even higher. The current caused by the applied voltage V may depend on the types, materials, sizes etc. of the semiconductor chip 14, the carrier 15 and the material 30 and may have a more complex time behavior than the applied voltage V. The voltage V may also be controlled to inject a predetermined current into the material 30. The current may have peak values between 1 and 1000 Å, in one embodiment between 100 and 350 Å. The temperature of the material 30 during the sintering process may, for example, be in the range from 100 to 350° C. and in one embodiment in the range from 150 to 250° C. and in one embodiment below 200° C.

Pulsed and constant (DC) currents may have different heating effects on the material 30, the carrier 15 and the semiconductor chip 14. For example, pulsed currents may cause fewer heating of the semiconductor chip 14 than constant currents.

The voltage V or current may be varied according to a desired heating of the material 30, the carrier 15 and the semiconductor chip 14. In one embodiment, this may be used to generate different temperatures in the semiconductor chip 14 and the carrier 15. For example, the semiconductor chip 14 may be heated to a higher temperature than the carrier 15. This may be used to reduce thermal expansion stress in the semiconductor device 200, e.g., by heating the semiconductor chip 14 and the carrier 15 so that their thermal expansion becomes roughly equal during the heating, e.g., differs by less than 50% or 30% or 10% of the thermal expansion. As an example, copper of which the carrier 15 may be manufactured has a thermal expansion coefficient of about $17 \times 10^{-6}$/K and silicon has a thermal expansion coefficient of about $3 \times 10^{-6}$/K. In this example, thermal expansion stress may be reduced if the silicon semiconductor chip 14 is heated to a higher temperature than the copper carrier 15.

External heating may be applied additionally, for example, in order to reduce the voltage V necessary to cure the glue or to sinter the metal particles. External heating may be applied to at least one of carrier 15 and semiconductor chip 14. In the embodiment illustrated in FIG. 2B, a voltage V is applied between the second surface 12 of the semiconductor chip 14 and the carrier 15. Additionally, a heating device 101, for example, a heating plate, is applied to the carrier 15 to raise the temperature of the material 30 to a temperature that is high enough so that the semiconductor chip 14 and the carrier 15 adhere together, e.g., a temperature that is high enough for curing the glue or for sintering the metal particles. The external heating may be applied during or before the application of the voltage V and may heat the semiconductor chip 14 and carrier 15 to different temperatures. External heating may be used to raise the temperature of semiconductor chip 14 or carrier 15 to 200° C. or higher. It may be provided that the heating provided by the heating device 101 is not sufficient to cure the glue or to sinter the metal particles alone, which means that it may be necessary to apply the voltage V to increase the temperature of the material 30 in order to cure the glue or to sinter the metal particles.

The semiconductor device 200 obtained after the curing or sintering process is illustrated in FIG. 2E. It contains the semiconductor chip 14, the layer 22 of cured glue or sintered metal particles and the carrier 15.

Figure 3A:
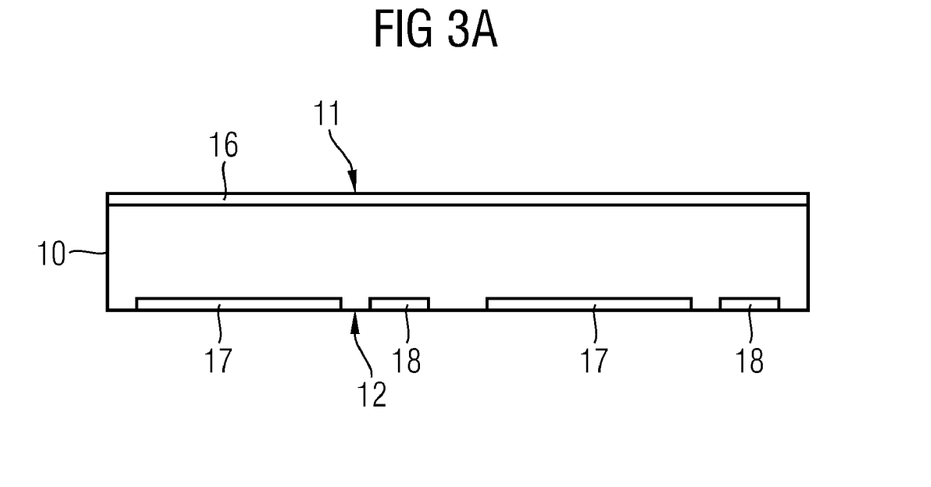
FIGS. 3A to 3I schematically illustrate one embodiment of a method to fabricate a device.
Figure 3B:
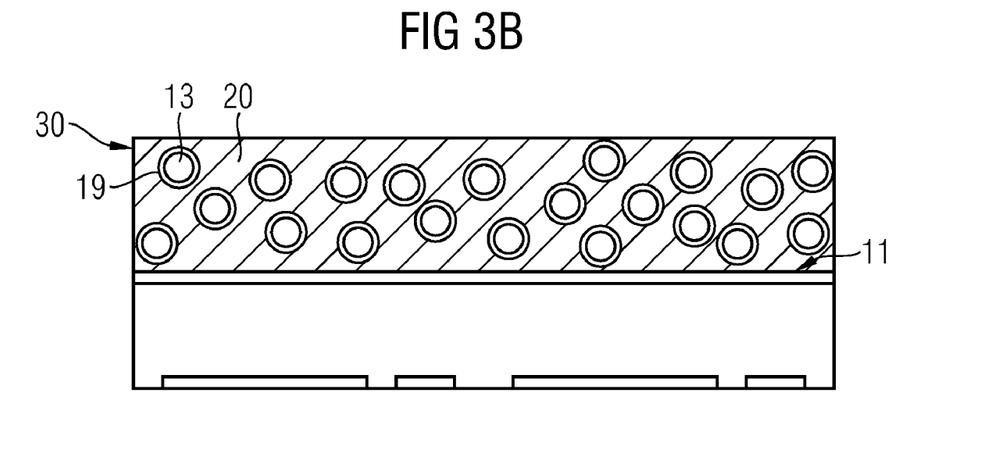
Figure 3C:
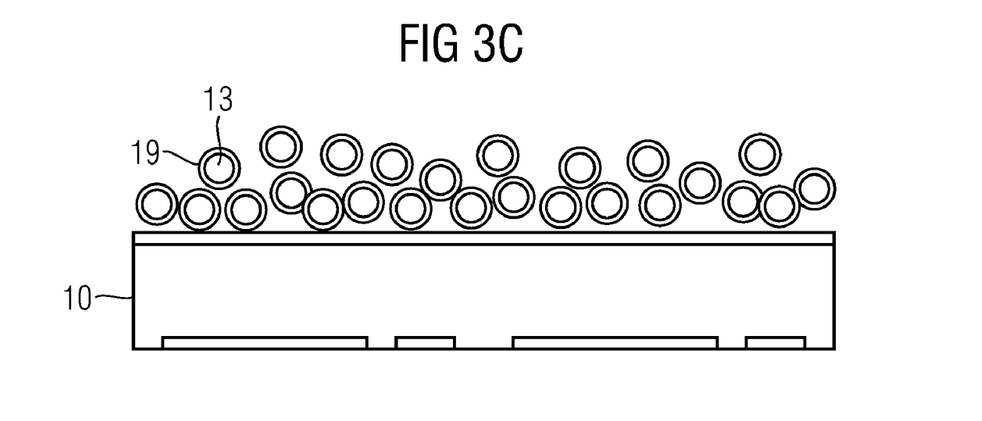
Figure 3D:
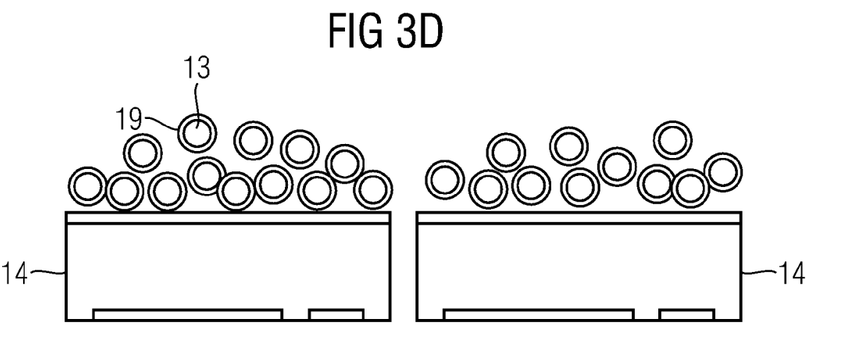
Figure 3E:
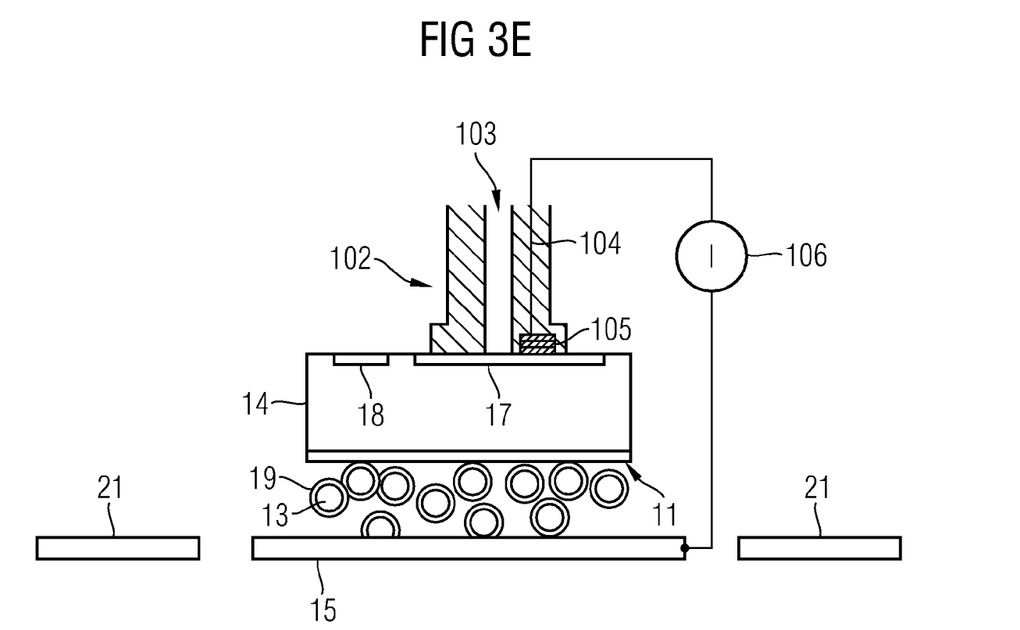
Figure 3F:
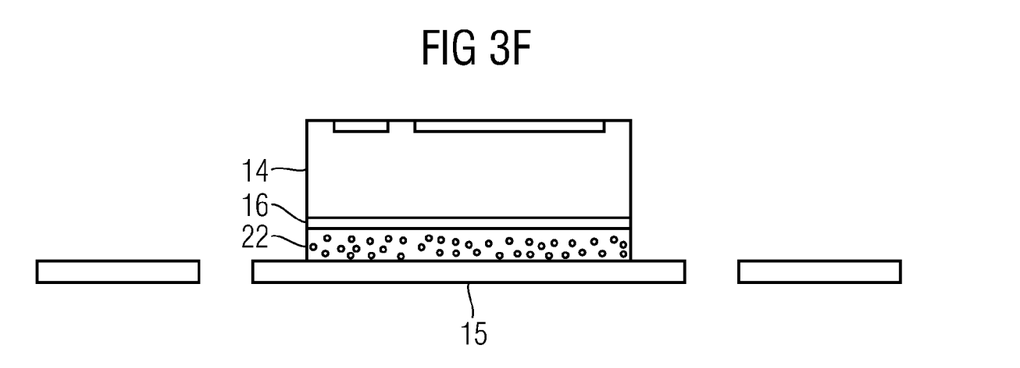
Figure 3G:
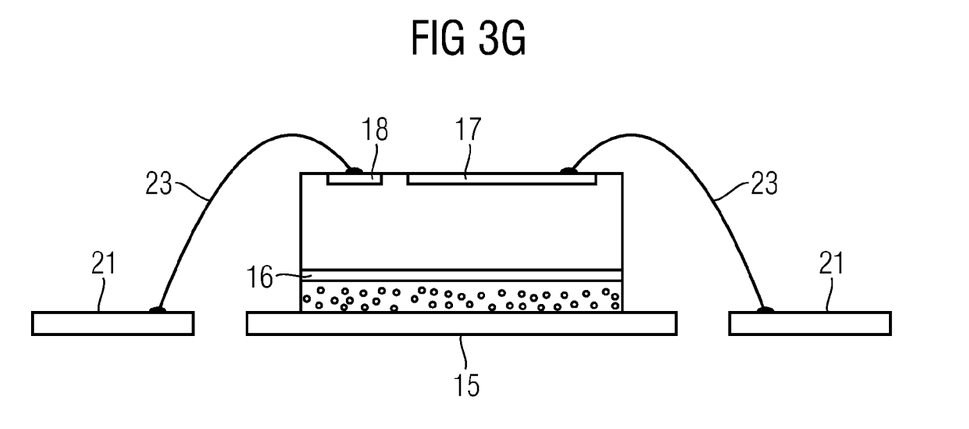
Figure 3H:
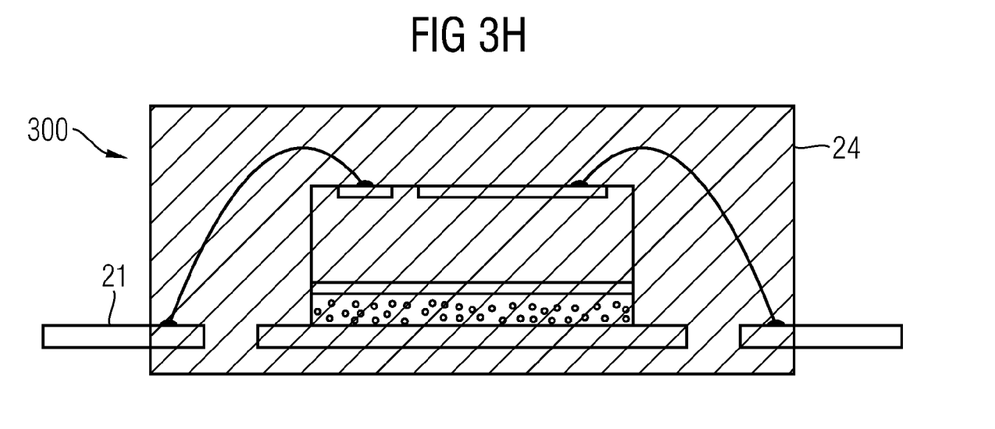
Figure 3I:
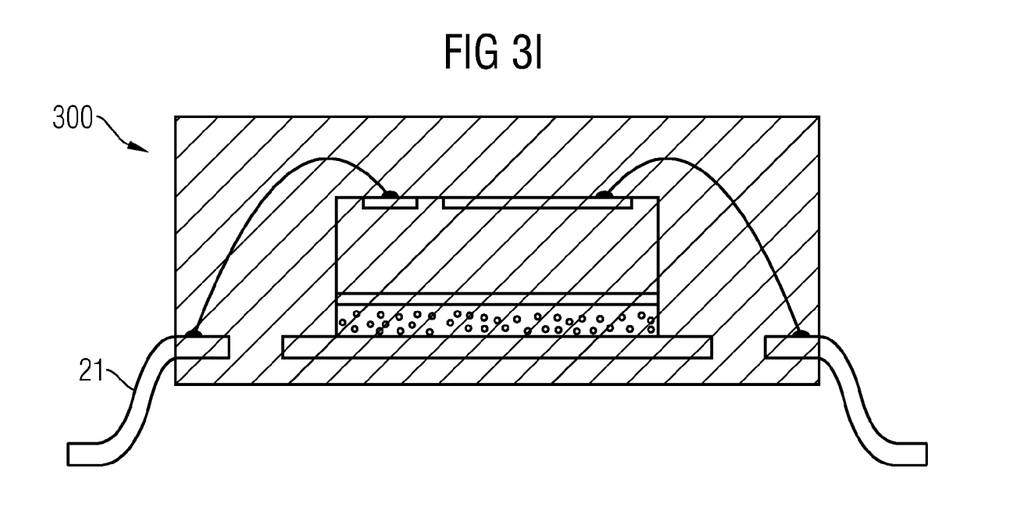
Figure 4A:
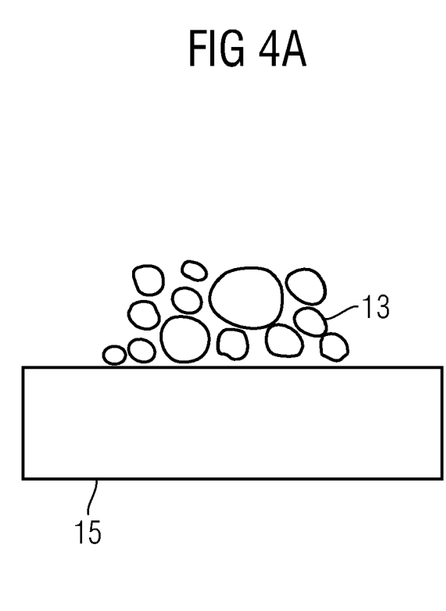
FIGS. 4A and 4B schematically illustrate one embodiment of a method to fabricate a device.
Figure 4B:
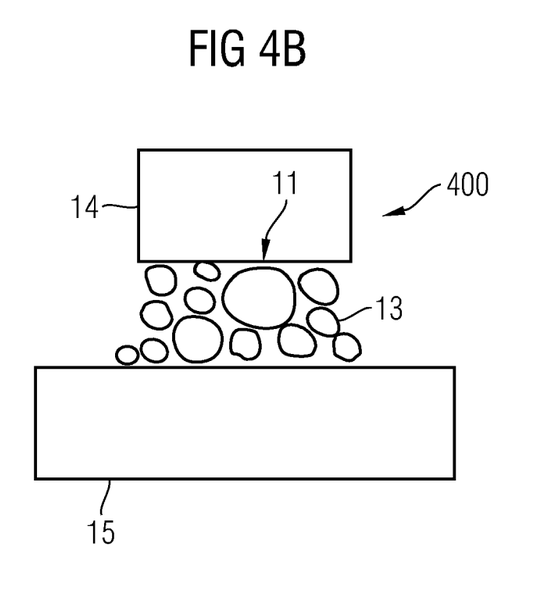

FIGS. 3A to 3I schematically illustrate a method for production of a device 300, a cross-section of which is illustrated in FIG. 3I. The method illustrated in FIGS. 3A to 3I is an implementation of the methods illustrated in FIGS. 1A to 1C and 2A to 2E. The details of the manufacturing method that are described below can therefore be likewise applied to the methods of FIGS. 1A to 1C and 2A to 2E.

The semiconductor chips 14 as well as all other semiconductor chips described herein may be fabricated on a wafer made of semiconductor material. The semiconductor wafer may have any shape and size and may be manufactured from any semiconductor material. Such a semiconductor wafer 10 is illustrated in FIG. 3A. The semiconductor wafer 10 has contact pads 16 on its first face 11 and contact pads 17 and 18 on its second face 12. The integrated circuits embedded in the semiconductor wafer 10 can be electrically accessed via the contact pads 16 to 18. The contact pads 16 to 18 may be made of a metal, for example, silver, aluminum or copper. In the embodiment illustrated in FIG. 3A the first face 11 is entirely coated with a metal layer 16. As an alternative, the metal layer 16 may be structured.

The integrated circuits contained in the semiconductor wafer 10 may be physically identical, but may also differ from each other. The integrated circuits may, for example, be vertical power diodes or vertical power transistors, for example, IGBTs, JFETs, power bipolar transistors or power MOSFETs. In the latter case, which is one example illustrated in FIG. 3A, the contact pad 16 may be the drain electrode of the power MOSFETs, and the contact pads 17 and 18 may function as the source and gate electrodes of the power MOSFETs, respectively.

Instead of vertical power diodes or vertical power transistors, other integrated circuits, such as logic circuits, may be contained in the semiconductor wafer 10. In one embodiment those circuits may be embedded in the semiconductor wafer 10 which have an electrode or contact pad on their backside.

As illustrated in FIG. 3B, metal particles 13 are applied to the first face 11 of the semiconductor wafer 10. The metal particles 13 may, for example, be made of silver, gold, copper, tin or nickel. According to one embodiment, the metal particles 13 may be made of a pure metal. The extensions (average diameter) of the metal particles 13 may be smaller than 100 nm and, in one embodiment, smaller than 50 nm or 10 nm or 5 nm. It may also be provided that only a fraction of the metal particles 13, which are applied to the semiconductor wafer 10, has such dimensions. For example, at least 10% or 20% or 30% or 40% or 50% or 60% or 70% of the electrically conductive particles 13 may have dimensions smaller than 100 nm or 50 nm or 10 nm or 5 nm. The other metal particles 13 may have larger dimensions.

The metal particles 13 may be coated with a layer 19 of an organic material or a flux material, for example, colophony. Furthermore, the metal particles 13 may be dispersed in a suitable liquid or solvent 20. The metal particles 13 together with the liquid or solvent 20 may form a paste 30. The paste 30 may be fluid, viscous or waxy. Pastes containing metal particles, which are coated with a layer of an organic or flux material and dispersed in a liquid, can, for example, be purchased from the companies Coocson Electronic (product name: N 1000), Advanced Nano-Particles (ANP), Harima Chemicals (product names: NPS-H and NHD-1) or NBE Technologies (product name: NBE Tech). Other products from these or other companies may in one embodiment be used and may serve the same purpose as described below.

The paste 30 containing the metal particles 13 may be applied to at least one of the first face 11 of the semiconductor chip 14, the semiconductor wafer 10 or the carrier 15.

In the example illustrated in FIG. 3B, the paste 30 containing the coated metal particles 13 is applied to the first face 11 of the semiconductor wafer 10. The application of the paste 30 may be performed by stencil printing or other printing technologies. Moreover, the paste 30 may be distributed by a squeegee. Other techniques for the application of the paste 30 to the semiconductor wafer 10 are also possible, for example, dispensing or spin-coating.

One of the tasks of the liquid or solvent 20 may be to enable the metal particles 13 to be applied to the first face 11 of the semiconductor wafer 10. Therefore, the liquid or solvent 20 may be chosen such that—depending on the application technique—it is fluid, viscous or waxy during the application of the paste 30.

After the application of the paste 30, the paste 30 may be exposed to a moderate temperature $T_1$ in an oven, which may be smaller than 150° C. The exposure time may be arbitrary, in one embodiment it may be long enough to allow the liquid or solvent 20 to at least partially evaporate leaving the metal particles 13 localized on the semiconductor wafer 10 as illustrated in FIG. 3C. The liquid or solvent 20 may evaporate without any residues. A heating device, e.g., a heating plate, may also be used to reach the temperature $T_1$. The temperature $T_1$ may be chosen such that the layers 19 coating the metal particles 13 do not melt, in one embodiment if the diameter of the metal particles 13 is smaller than 50 nm or 10 nm or 5 nm. According to an alternative embodiment, the layers 19 may at least partially melt or evaporate at the temperature $T_1$.

The layers 19 coating the metal particles 13 may prevent premature agglomeration of the metal particles 13.

After the evaporation of the liquid or solvent 20, the semiconductor wafer 10 may be singulated (i.e., diced) thereby separating the individual semiconductor chips 14 as illustrated in FIG. 3D. Singulating the semiconductor wafer 10 may be carried out by sawing or any other appropriate technique, for example, laser ablation, cutting, stamping, milling or etching. Although only two of the semiconductor chips 14 are illustrated in FIG. 3D, any number of semiconductor chips 14 can be obtained from the semiconductor wafer 10.

The layers 19 of organic material or flux material coating the metal particles 13 may ensure that the metal particles 13 adhere sufficiently well to the first surface 11 of the semiconductor wafer 10 and to each other so that at least a sufficient fraction of the metal particles 13 remain on the first surface 11 even after the dicing of the semiconductor wafer 10.

As illustrated in FIG. 3E, at least one of the semiconductor chips 14 may be picked up and placed over the electrically conductive carrier 15 with the first face 11 and the electrically conductive particles 13 facing the carrier 15. A pick and place structure 102 may be used for picking up the semiconductor chip 14 from a first location and for placing it to a second location over the carrier 15. The pick and place structure 102 may, for example, be removably attached to the semiconductor chip 14 by using vacuum pressure. For example, the pick and place structure 102 may be put onto the semiconductor chip 14 and may be removably attached to the semiconductor chip 14 by removing air from a channel 103. The pick and place structure 102 may press the semiconductor chip 14 on the carrier 15. The pressure may be in the range from 1 to 40 MPa. The pick and place structure 102 may have a contact element 105, for example, a contact pad, for providing electrical contact to the semiconductor chip 14. The contact pad 105 may be connected via an electrically conductive line 104 to a power, voltage or current supply 106. The power supply 106 may also be connected to the carrier 15 so that a current can be injected in the metal particles 13. In one embodiment, carrier 15 and power supply 106 may both be connected to ground.

The carrier 15 may, for example, be a part of a leadframe, such as a die pad. The leadframe may further include leads 21 and other die pads. The leadframe may be manufactured from a metal or metal alloy, for example, copper, a copper alloy, iron nickel, aluminum, or other electrically conductive materials. Furthermore, the leadframe may be plated with an electrically conductive material, for example, copper, silver, iron nickel or nickel phosphorus. The shape of the leadframe is not limited to any size or geometric shape. The leadframe may have been manufactured by punching a metal plate. The die pads and leads of the leadframe may be connected to each other by dams. Moreover, the carrier 15 may also be fabricated from polymers or paper and at least one surface of the carrier 15 may be coated with an electrically conductive layer. The electrically conductive layer may be produced by metal plating or depositing metal particles or any other appropriate method.

In FIG. 3E only one semiconductor chip 14 is illustrated placed over the leadframe. Further semiconductor chips may also be placed over the leadframe. These semiconductor chips may have been fabricated on the same semiconductor wafer, but may in one embodiment have been manufactured on different semiconductor wafers. Furthermore, the semiconductor chips may be physically identical, but may also contain different integrated circuits.

A current may be injected into the metal particles 13 by using the pick and place structure 102, e.g., the contact element 105. The current may be injected simultaneously with the placing process or afterwards. The pick and place structure 102 may be positioned on the semiconductor chip 14 so that the current is applied to a particular electrode on the semiconductor chip 14, e.g., the source electrode 17 as illustrated in FIG. 3E. The gate electrode 18 can be used to control the current through the semiconductor chip 14 and through the metal particles 13, e.g., by applying an additional control signal (not illustrated in FIG. 3E) to the gate electrode 18. If several electrodes are used, different currents or voltages may be applied to the different electrodes, respectively. The current may be applied through one or several contact pads 105, with the contact pads 105 being of arbitrary size and shape. In one embodiment, the contact pads 105 may have a size equal to or similar to one or several electrodes 17, 18 of the semiconductor chip 14 or may be equal or similar to the size of the semiconductor chip 14.

The current through the metal particles 13 may cause sintering of the metal particles 13 due to the heat generated by the current as described above. The process may be accompanied by additional external heating.

The heat generated by the current and, if provided, the additional external heating generate a temperature $T_2$ to which the metal particles 13 are exposed. In one embodiment, the temperature $T_2$ is high enough to cause the layers 19 coating the electrically conductive particles 13 to sublimate or evaporate. Furthermore, the temperature $T_2$ may be lower than the melting temperature of the metal of which the metal particles 13 are made when the material is provided in macroscopic (bulk) dimensions. After the layers 19 are removed, the electrically conductive particles 13 may form a solid layer 22 by sintering due to the temperature $T_2$. The temperature $T_2$ may be in the range from 100 to 350° C. and in one embodiment in the range from 150 to 250° C. and in one embodiment below 200° C. The temperature $T_2$ may depend on the material of the electrically conductive particles 13.

The sinter temperature of the metal particles 13 may depend on the material of the metal particles 13 and their sizes. The smaller the sizes of the metal particles 13, the lower the sinter temperature may be. Thus, the sinter temperature may be reduced by reducing the diameters or dimensions of the metal particles 13.

The additional external heating may, for example, be provided by a hot plate or an oven (not illustrated in FIG. 3E). For example, the carrier 15 may be heated by a hot plate to a temperature lower than the temperature $T_2$. The semiconductor chip 14 may be placed on the heated carrier 15. In one embodiment, both the carrier 15 and the semiconductor chip 14 may be placed in an oven and heated to a temperature lower than the temperature $T_2$. During the sintering process the semiconductor chip 14 may be pressed onto the carrier 15 for an appropriate time. The pick and place structure 102 may also be configured to apply external heating to the semiconductor chip 14.

The layers 19 coating the metal particles 13 before the sintering process may prevent oxidation of the metal particles 13. If an outer layer of the metal particles 13 is oxidized, a higher temperature $T_2$ would be required to sinter the metal particles 13. Due to the different thermal expansion coefficients of the semiconductor chip 14 and the carrier 15 a low temperature $T_2$ is desired to reduce the mechanical stress induced into the semiconductor chip 14 by the carrier 15 during the sintering process.

As illustrated in FIG. 3F, the sintered layer 22 fastens the semiconductor chip 14 to the carrier 15 and electrically couples the contact pad 16 to the electrically conductive carrier 15. The pick and place structure 102 and the electric contacts to the power supply 106 may be removed. The sintered layer 22 may be of any thickness, in one embodiment its thickness may be in the range from 1 to 30 µm. Pores may be distributed over the sintered layer 22.

After the attachment of the semiconductor chip 14 to the carrier 15, electrical interconnections may be established from the contact pads 17 and 18 of the semiconductor chip 14 to the leads 21. As illustrated in FIG. 3G, the interconnections may be made by wire bonding. For example, ball bonding or wedge bonding may be used as the interconnect technique. The bond wires 23 may be made up of gold, aluminum, copper or any other appropriate electrically conductive material. One or more bond wires 23 may be attached to electrically couple each of the contact pads 17 and 18 to the leads 21. The carrier 15 may be connected to other leads not illustrated in FIG. 3G. This lead 21 and the carrier 15 may be made of one piece.

As alternatives to wire bonding, other interconnect techniques may be used. For example, metallic clips may be placed on the semiconductor chip 14 and the leads 21 in order to establish the electrical connections.

A mold transfer process may be carried out to encapsulate the components arranged on the leadframe with a mold material 24 as illustrated in FIG. 3H. The mold material 24 may encapsulate any portion of the device 300, but leaves at least parts of the leads 21 uncovered. The exposed parts of the leads 21 may be used as external contact elements to electrically couple the device 300 to other components, for example, a circuit board, such as a PCB (Printed Circuit Board).

The mold material 24 may be composed of any appropriate electrically insulating thermoplastic or thermosetting material, in one embodiment it may be composed of a material commonly used in contemporary semiconductor packaging technology. Various techniques may be employed to cover the components of the device 300 with the mold material 24, for example, compression molding, injection molding, powder molding or liquid molding.

Before or after the encapsulation with the mold material 24, the individual devices 300 are separated from one another by separation of the leadframe, for example, by sawing the dams. Afterwards, the leads 21 may be bent and/or trimmed as illustrated in FIG. 3I in order to mount the device 300 on a circuit board. Instead of having the leads 21 protruding from the mold material 24, it is also possible to have a leadless device 300.

It is obvious to a person skilled in the art that the devices 100, 200 and 300 illustrated in FIGS. 1 to 3 are only intended to be exemplary embodiments, and many variations are possible. For example, it is possible to use metal particles 13 which have dimensions higher than 100 nm, for example, in the range from 1 to 3 µm. These metal particles 13 may, for example, be made of AuSn or other metal alloys. They may also be coated by a layer 19 made of an organic or flux material and may be dispersed in a solvent 20. However, rather than being sintered these metal particles 13 may be melted when attached to the carrier 15. The temperature $T_2$ may be in the range from 300 to 400° C. and depends on the material of the metal particles 13.

Another variation of the method illustrated in FIGS. 3A to 3I is to stack two or more semiconductor chips on top of each other and using the method described above for attaching the semiconductor chips.

In the embodiments illustrated in FIGS. 4A to 4B and 5A to 5B, the semiconductor wafer 10 has been singulated into semiconductor chips 14 without applying the metal particles 13 containing paste 30 or the metal particles 13 to the semiconductor wafer 10. In the example illustrated in FIG. 4A, the paste 30 containing the metal particles 13 is applied to the carrier 15, and the semiconductor chip 14 is then placed onto the metal particles 13 on the carrier 15 (see FIG. 4B). The application of the paste 30 may be performed by stencil printing or other printing technologies. Moreover, the paste 30 may be distributed by a squeegee. Other techniques for the application of the paste 30 to the carrier 15 are also possible, for example, dispensing or spin-coating.

Figure 5A:
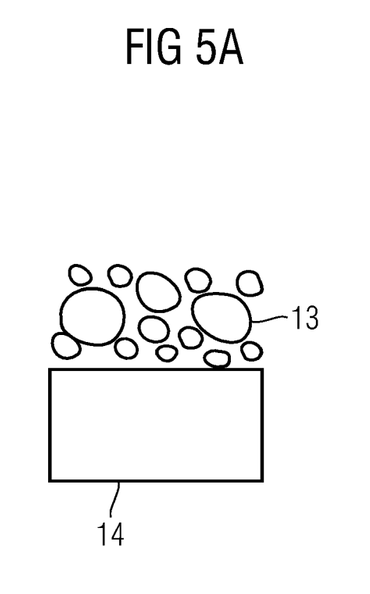
FIGS. 5A and 5B schematically illustrate one embodiment of a method to fabricate a device.
Figure 5B:
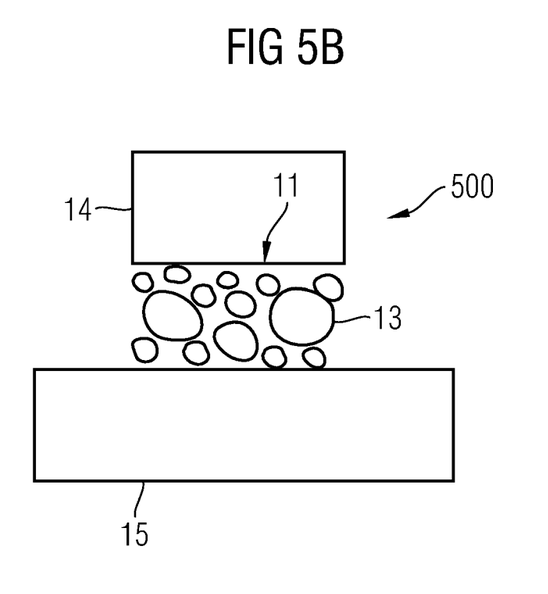

In the example illustrated in FIG. 5A, the paste 30 containing the metal particles 13 is applied to a first face 11 of the singulated semiconductor chip 14 and the semiconductor chip 14 is placed onto the carrier 15 with the metal particles 13 facing the carrier 15 (see FIG. 5B).

As described above, the metal particles 13 may be applied in form of a paste 30 containing the metal particles 13. Although not illustrated in FIGS. 4A and 4B, the carrier 15 may be heated to a temperature lower than the sintering temperature of the metal particles 13, so that fluids and/or coatings of the metal particles 13 may evaporate. The semiconductor chip 14 may be heated to arbitrary temperatures in this example.

In the embodiment illustrated in FIGS. 5A and 5B, the semiconductor chip 14 may be heated to a temperature lower than the sintering temperature of the metal particles 13, so that fluids and/or coatings of the metal particles 13 may evaporate. The carrier 15 may be heated to arbitrary temperatures in this example.

Figure 6A:
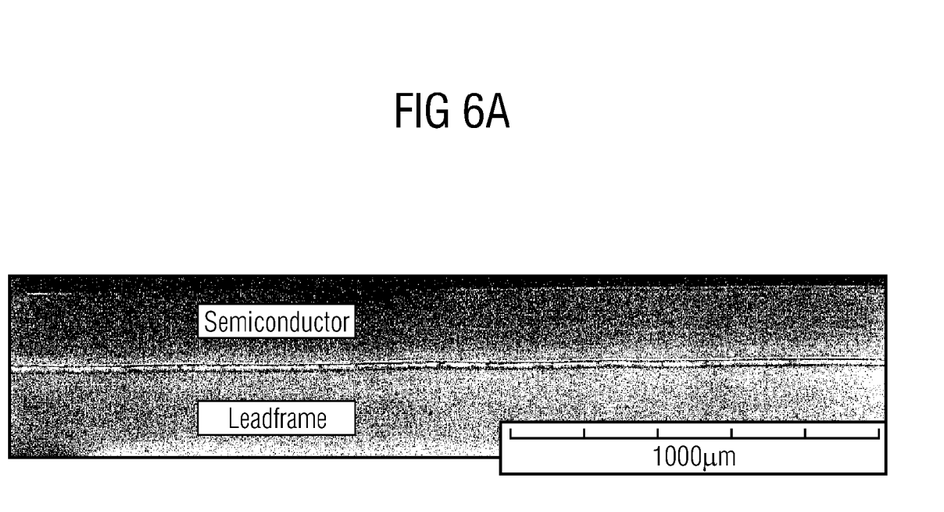
FIGS. 6A and 6B illustrate microscopic images of a semiconductor chip mounted on a leadframe.
Figure 6B:
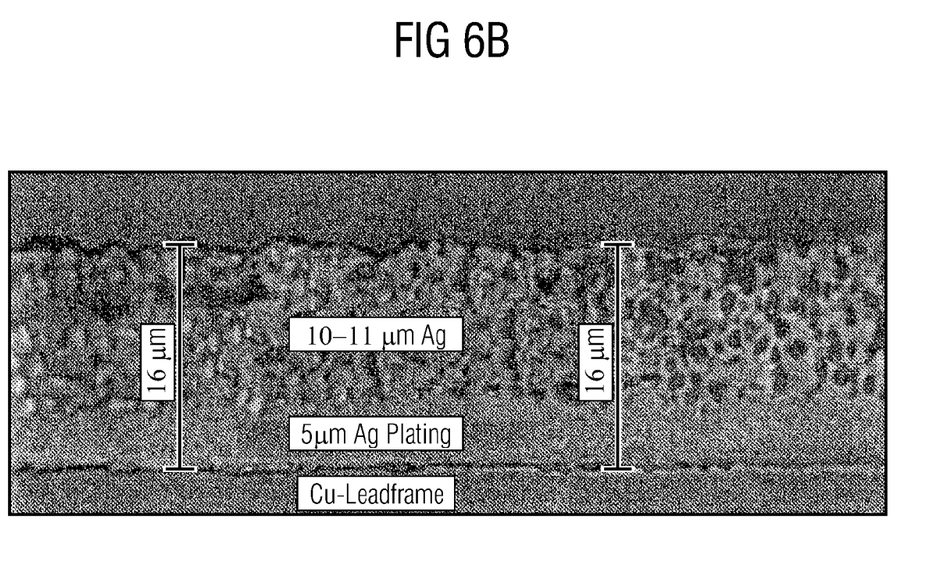

In FIGS. 6A and 6B microscopic images are illustrated of a cross section of a semiconductor chip mounted on a leadframe. In this present example a paste containing silver particles was applied to a semiconductor wafer. The paste was dried at a temperature $T_1$ of 95° C. for 10 minutes. A layer of silver particles having a layer thickness of about 15 µm was obtained. After dicing the semiconductor wafer, one of the semiconductor chips was mounted on a leadframe coated with a 5 µm layer of silver at a temperature $T_2$ of 300° C. for 6 seconds.

As can be seen from FIG. 6B the silver layer attaching the semiconductor chip to the leadframe has a thickness of 10 to 11 µm and a spongy structure which is due to the sintering process.

Figure 7:
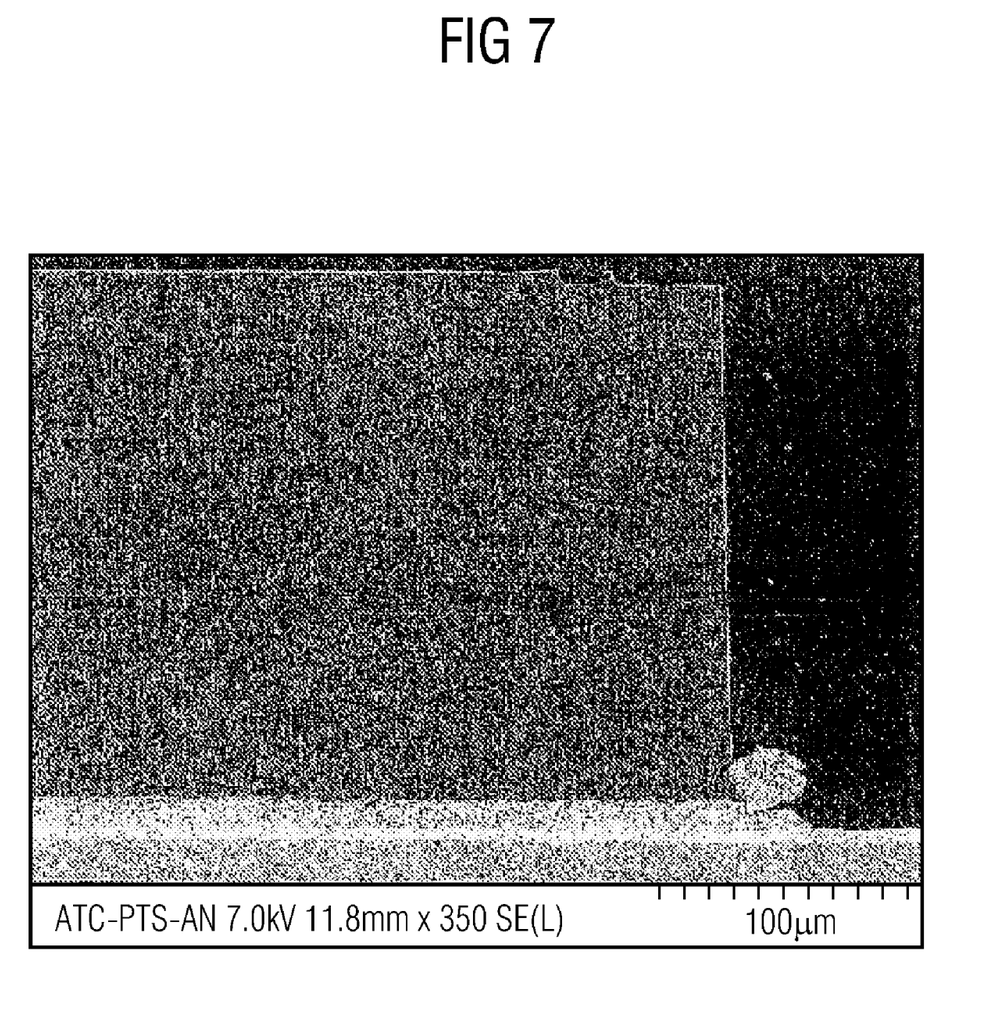
FIG. 7 illustrates an electron microscopic image of a semiconductor chip mounted on a leadframe.

FIG. 7 illustrates an electron microscopic image of a further cross section of a semiconductor chip mounted on a leadframe by using a sintering method. As is illustrated in FIG. 7, only a little electrically conductive material is squeezed out when the semiconductor chip is mounted on the leadframe. Furthermore, the sintered layer has a very uniform thickness and contains only a few voids.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a carrier and a semiconductor chip;
applying metal particles to at least one of the carrier and the semiconductor chip;
placing the semiconductor chip over the carrier and the metal particles; and
injecting a current into the metal particles through the semiconductor chip for attaching the semiconductor chip to the carrier.

2. A method of manufacturing a semiconductor device, comprising:
providing a carrier;
providing a semiconductor chip with a first face and a second face opposite to the first face;
applying an electrically conductive paste to at least one of the carrier and the first face of the semiconductor chip;
placing the semiconductor chip over the carrier with the first face facing the carrier such that the electrically conductive paste is positioned between the carrier and the first face of the semiconductor chip; and
applying a voltage between the second face of the semiconductor chip and the carrier in order to inject a current into the electrically conductive paste through the semiconductor chip for attaching the semiconductor chip to the carrier.

3. A method, comprising:
applying metal particles to a face of a semiconductor wafer;
singulating the semiconductor wafer with the metal particles for obtaining a plurality of semiconductor chips;
placing at least one of the plurality of semiconductor chips over a carrier with the metal particles facing the carrier; and
heating the metal particles by injecting a current through the at least one semiconductor chip into the metal particles for attaching the at least one semiconductor chip to the carrier.

4. The method of claim 1, comprising configuring the current to sinter the metal particles.

5. The method of claim 1, comprising providing the metal particles coated with an organic material or a flux material when applied to at least one of the carrier and the semiconductor chip, and removing the organic material or flux material when the current is injected into the metal particles.

6. The method of claim 1, comprising injecting current pulses into the metal particles.

7. The method of claim 1, comprising heating the carrier by a heating unit.

8. The method of claim 1, wherein injecting the current comprises injecting the current through an electrode on a face of the semiconductor chip opposite the metal particles, the method further comprising:
applying a control signal to a gate electrode of the semiconductor chip to control the current through the semiconductor chip.

9. The method of claim 2, comprising applying an encapsulating material to the semiconductor chip after applying the voltage between the second face of the semiconductor chip and the carrier.

10. The method of claim 2, wherein the electrically conductive paste comprises metal particles.

11. The method of claim 2, comprising applying the voltage during a time duration of less than 10 seconds.

12. The method of claim 2, comprising applying the voltage in pulses.

13. The method of claim 2, comprising picking the semiconductor chip from a first location and placed to a second location over the carrier.

14. The method of claim 2, comprising configuring the voltage to create a current between the second face of the semiconductor chip and the carrier in a range from 10 to 500 amperes.

15. The method of claim 2, comprising configuring the voltage to create a temperature between the semiconductor chip and the carrier in a range from 100 to 300° C.

16. The method of claim 2, comprising heating the carrier by a heating unit.

17. The method of claim 2, wherein the voltage between the second face of the semiconductor chip and the carrier causes a current through the semiconductor chip and the electrically conductive paste.

18. The method of claim 2, wherein applying the voltage comprises applying the voltage between the carrier and an electrode on the second face of the semiconductor chip, the method further comprising:

applying a control signal to a gate electrode of the semiconductor chip to control a current through the semiconductor chip.

19. The method of claim 10, comprising configuring the voltage to sinter the metal particles.

20. The method of claim 12, comprising wherein pause intervals separate successive pulses and a time duration of one of the pause intervals is shorter than a time duration of one of the pulses.

21. The method of claim 13, comprising picking and placing the semiconductor chip by a pick and place structure removably attached to the semiconductor chip.

22. The method of claim 21, comprising removably attaching the pick and place structure to the semiconductor chip using vacuum pressure.

23. The method of claim 21, comprising applying the voltage using the pick and place structure.

24. The method of claim 3, comprising sintering the metal particles when heated.

25. The method of claim 3, comprising dispersing the metal particles in a liquid when applied to the semiconductor wafer.

26. The method of claim 3, wherein injecting the current comprises injecting the current through an electrode on a face of the semiconductor chip opposite the metal particles, the method further comprising:

applying a control signal to a gate electrode of the semiconductor chip to control the current through the semiconductor chip.

27. The method of claim 25, comprising applying heat to the semiconductor wafer until the liquid is at least partially evaporated.

* * * * *

UNITED STATES PATENT AND TRADEMARK OFFICE
CERTIFICATE OF CORRECTION

PATENT NO. : 7,754,533 B2  Page 1 of 1
APPLICATION NO. : 12/200183
DATED : July 13, 2010
INVENTOR(S) : Nikitin It is certified that error appears in the above-identified patent and that said Letters Patent is hereby corrected as shown below:

Column 13, line 7, delete "300° C" and insert in place thereof --300 °C--.

Signed and Sealed this

Thirtieth Day of November, 2010

David J. Kappos
*Director of the United States Patent and Trademark Office*